United States Patent [19]
Okamura et al.

[11] Patent Number: 5,404,118
[45] Date of Patent: Apr. 4, 1995

[54] BAND PASS FILTER WITH RESONATOR HAVING SPIRAL ELECTRODES FORMED OF COIL ELECTRODES ON PLURALITY OF DIELECTRIC LAYERS

[75] Inventors: Hisatake Okamura; Teruhisa Tsuru; Tetsuo Taniguchi; Ken Tonegawa, all of Nagaokakyo, Japan

[73] Assignee: Murata Manufacturing Co., Ltd., Kyoto, Japan

[21] Appl. No.: 96,716

[22] Filed: Jul. 23, 1993

[30] Foreign Application Priority Data

Jul. 27, 1992 [JP] Japan .................. 4-220852
Jul. 27, 1992 [JP] Japan .................. 4-220853

[51] Int. Cl.⁶ .......................... H03H 7/00; H01P 7/00
[52] U.S. Cl. .................. 333/175; 333/185; 333/219
[58] Field of Search ............ 333/177, 181, 184, 185, 333/219; 336/200

[56] References Cited

U.S. PATENT DOCUMENTS 4,322,698  3/1982  Takahashi et al. ............ 333/184
4,918,570  4/1990  Okamura et al. ............ 333/202 X
5,075,650  12/1991  Okamura et al. ............ 333/185 X
5,126,707  6/1992  Ikeda ........................ 333/185

FOREIGN PATENT DOCUMENTS 0026011  2/1991  Japan ........................ 333/219

*Primary Examiner*—Seungsook Ham
*Attorney, Agent, or Firm*—Ostrolenk, Faber, Gerb & Soffen

[57] ABSTRACT

Coil electrodes having a U-shape and shield electrodes having a plane shape are formed on plural dielectric layers. The coil electrodes are connected via through holes which are formed through the dielectric layers, and a spiral electrode is formed. An earth terminal and an input/output terminal are drawn out from the coil electrode to the end portion of the dielectric layer. The shield electrodes are formed on both of the coil electrodes. The dielectric layers are laminated, and the shield electrode and the earth terminal are connected by an external electrode. An external electrode connected to the input/output terminal is formed. A band-pass filter is made by forming plural spiral electrodes and magnetically coupling the spiral electrodes.

6 Claims, 21 Drawing Sheets

FIG. 2
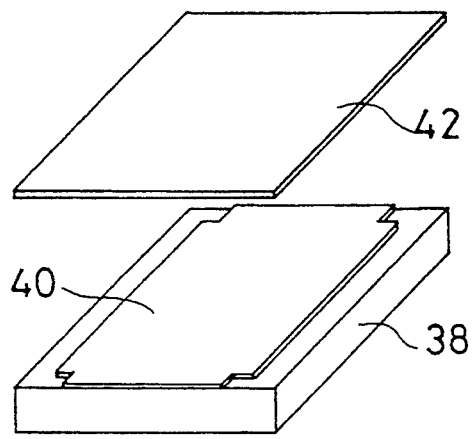
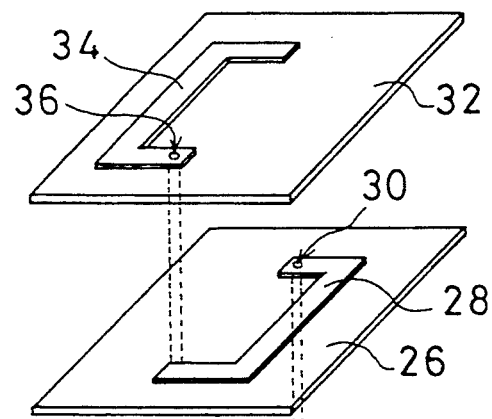
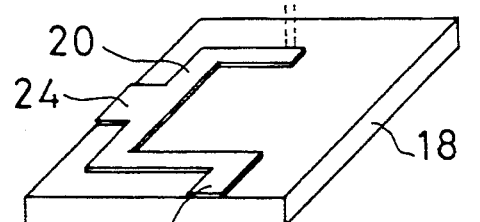
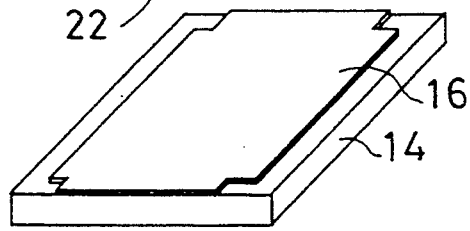

F I G. 4
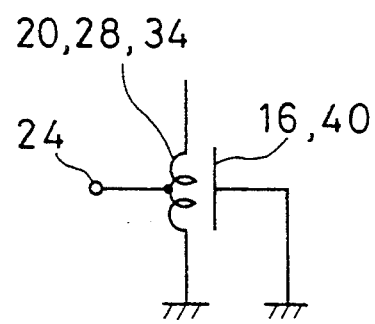

F I G. 6
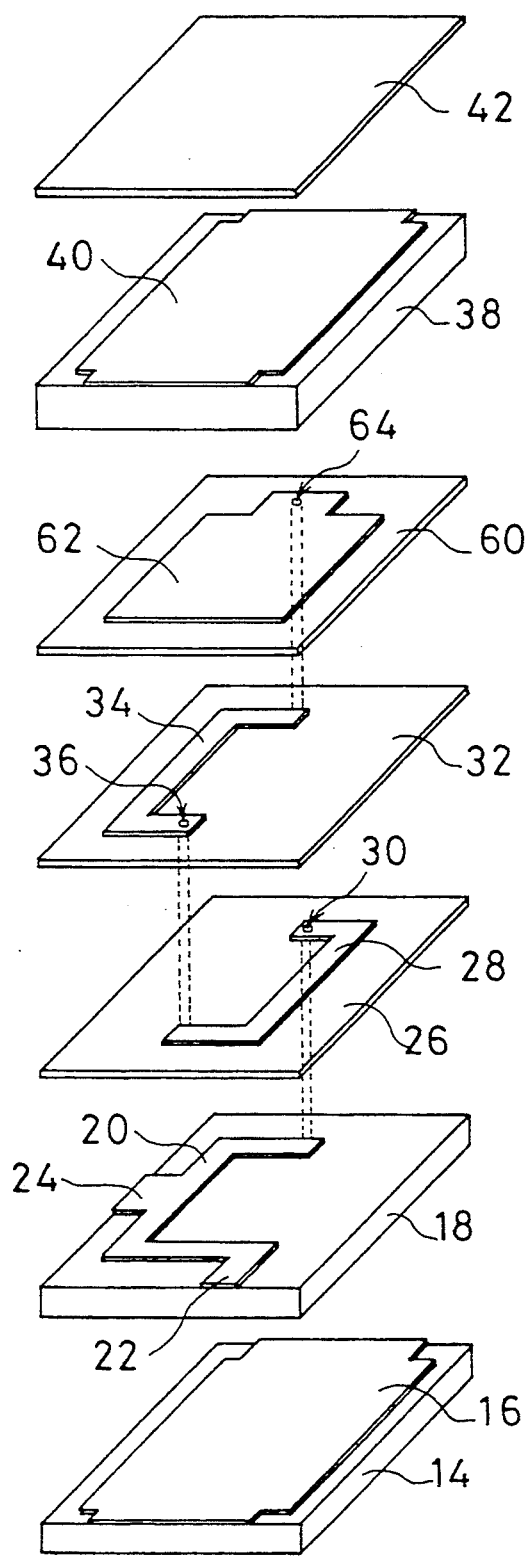

F I G. 7
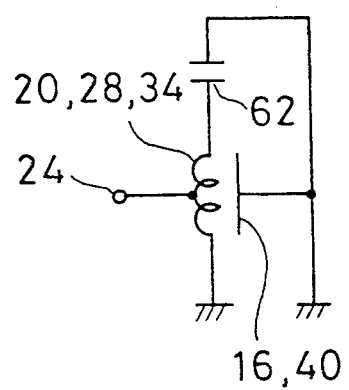

F I G. 9
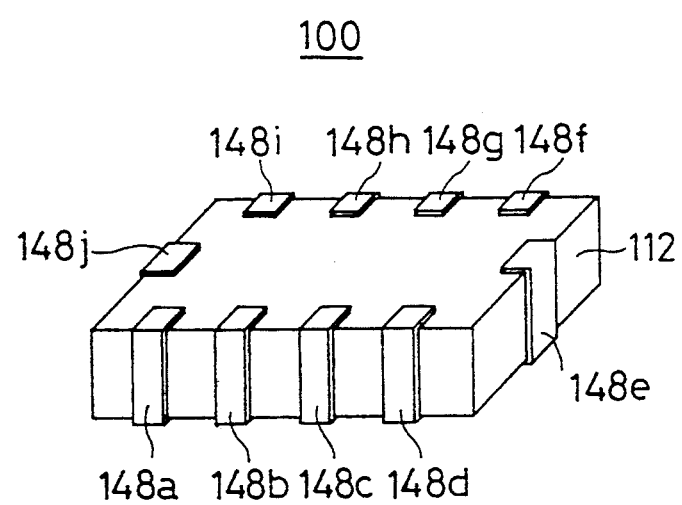

F I G. 11
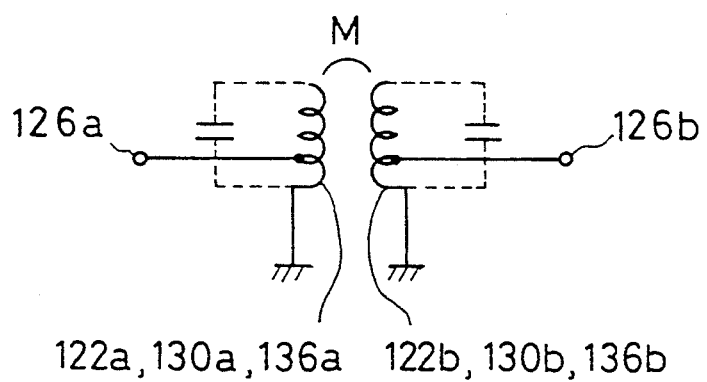

F I G. 14
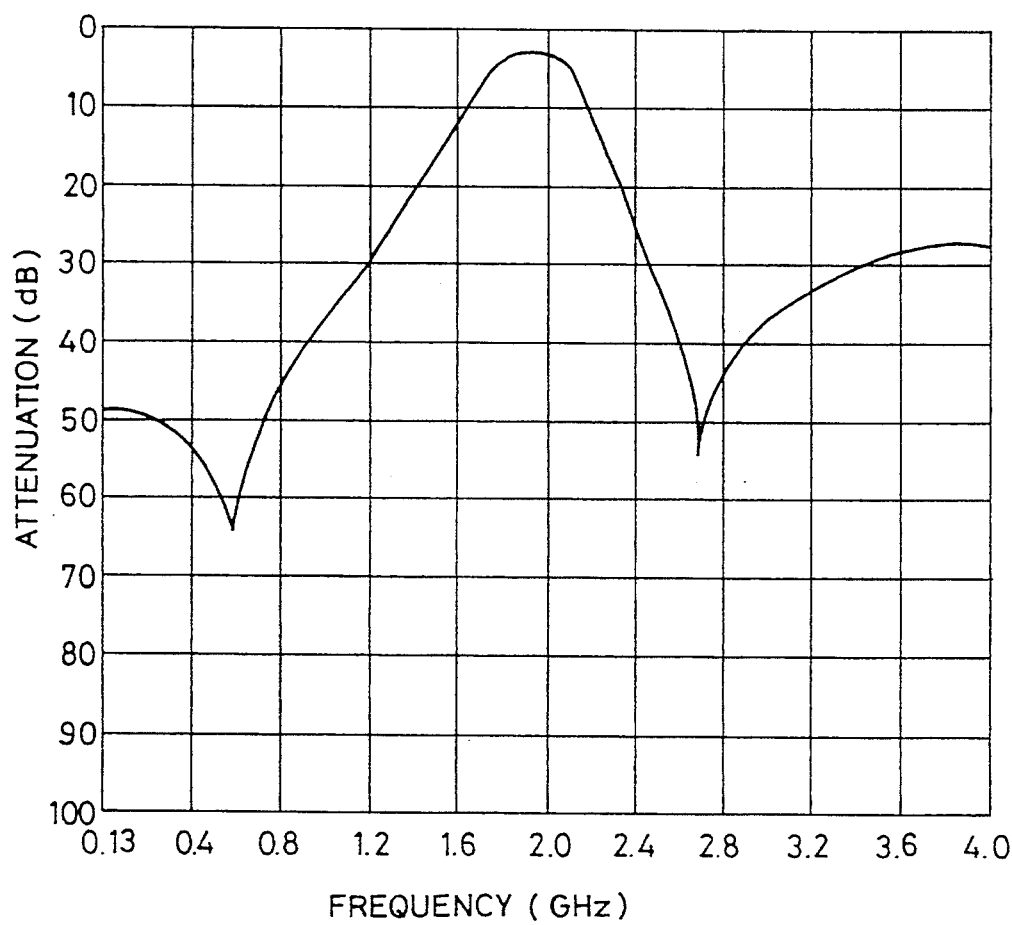

F I G. 16
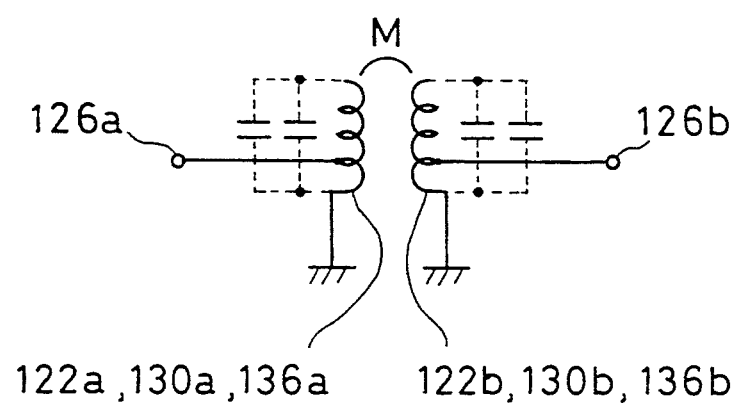

F I G. 17
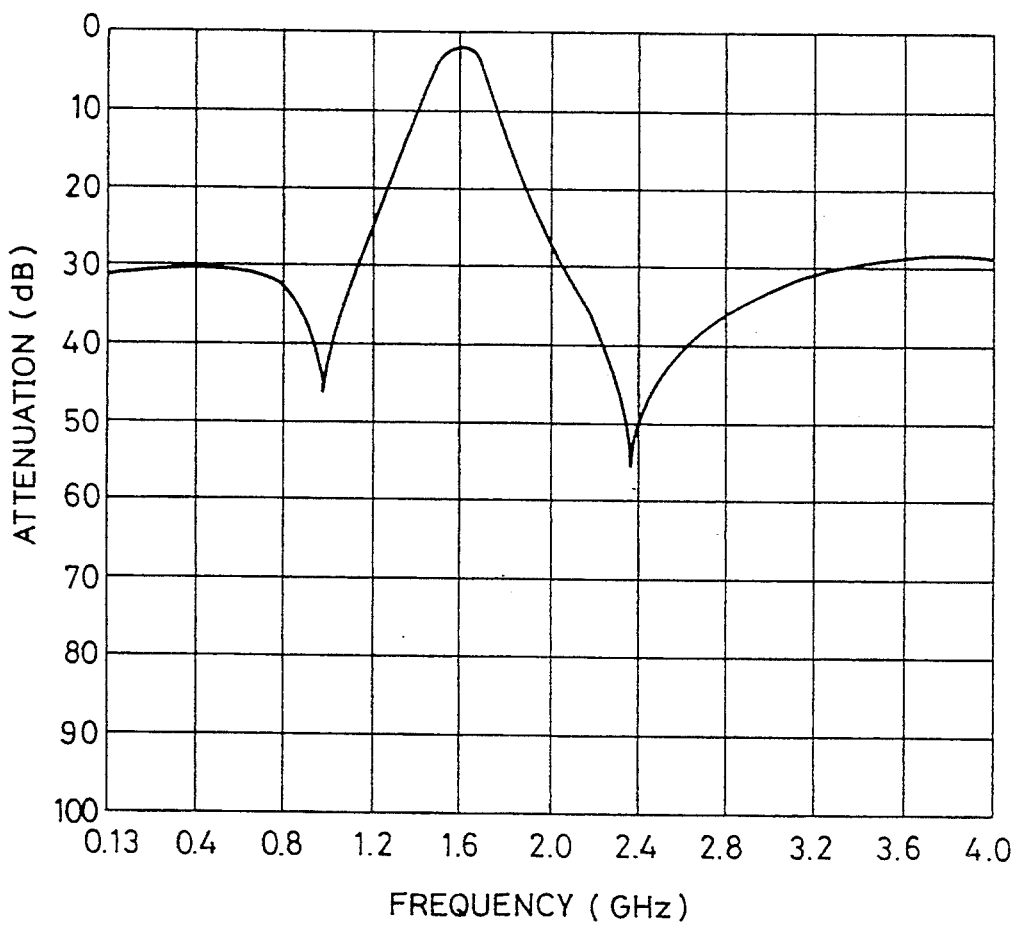

F I G. 19
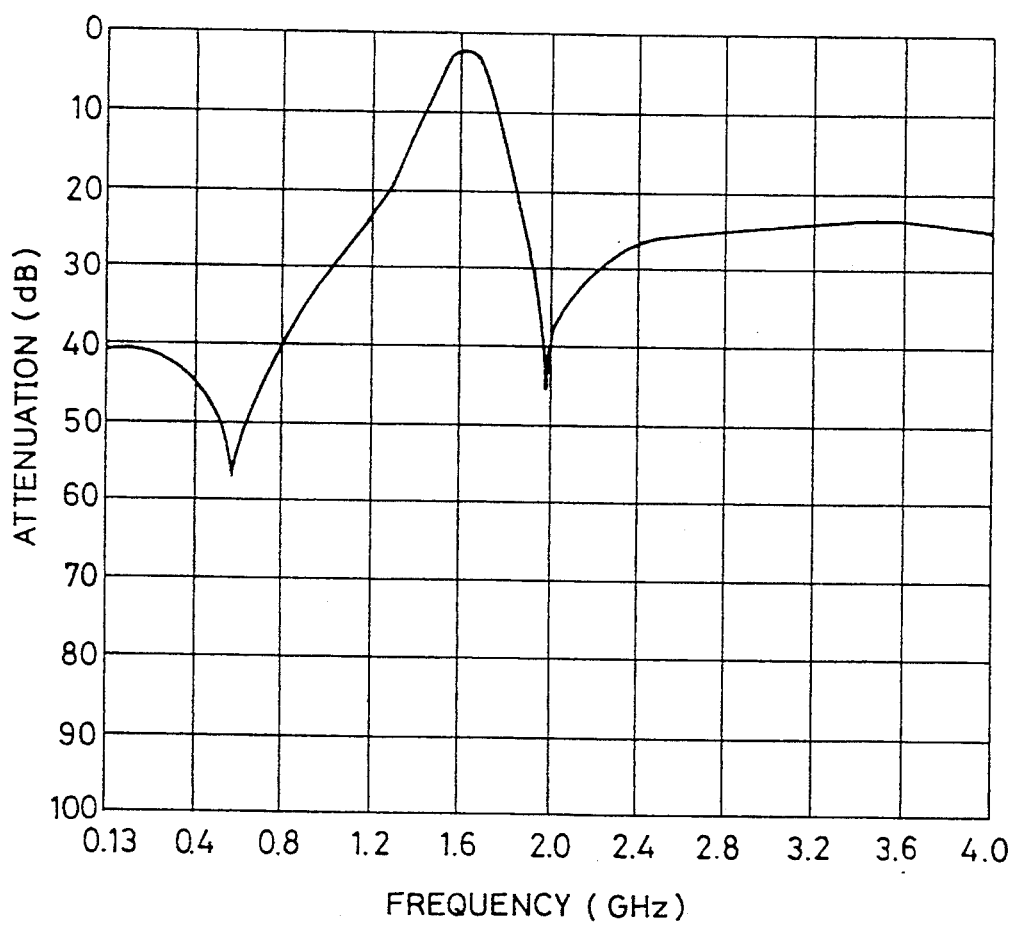

BAND PASS FILTER WITH RESONATOR HAVING SPIRAL ELECTRODES FORMED OF COIL ELECTRODES ON PLURALITY OF DIELECTRIC LAYERS

BACKGROUND OF THE INVENTION

1. Field of the Invention

The present invention relates to a resonator and a band-pass filter using the same, and particularly, it relates to a resonator used at a band of several GHz and a band-pass filter using the same.

2. Description of the Prior Art

In a conventional resonator, there are strip line resonators of $\frac{1}{2}$ wavelength as shown in FIGS. 20 and 21. The resonator 1 has a line electrode 3 whose both ends are open on one surface of a dielectric plate 2, and has an earth electrode 3 formed throughout the other surface of the dielectric plate 2. In the resonator 1, when $\lambda$ is defined as wavelength and $\epsilon$ is defined as an effective dielectric constant of the dielectric plate 2, the length $L_1$ of the line electrode 3 is determined as shown in Equation 1.

$$L_1 = \frac{1}{2} \lambda \times \frac{1}{\sqrt{\epsilon}} \qquad \text{Equation 1}$$

As shown in FIG. 22, there is a resonator of $\frac{1}{4}$ wavelength having a line electrode 3 whose one end is connected to an earth electrode via a side face of the dielectric plate 2. The length $L_2$ of the line electrode 3 of the resonator 1 is determined as shown in Equation 2.

$$L_2 = \frac{1}{4} \lambda \times \frac{1}{\sqrt{\epsilon}} \qquad \text{Equation 2}$$

As shown in FIG. 23, there is a resonator having a circinate coil electrode 4 which is formed on one surface of dielectric plate 2. In the resonator 1, an earth electrode 5 is formed on the other surface of the dielectric plate 4 so that it is opposed to the coil electrode 4. An earth terminal 6 is drawn out from one end of the coil electrode 4 to connect to the earth electrode 5, and a an input/output terminal 7 is formed at a distance from the earth terminal 6. In the resonator 1, since the coil electrode 4 is formed in a circinate shape, the resonator 1 can be miniaturized even when the coil electrode 4 is long. And, a band-pass filter can be obtained by locating resonators side by side and magnetically coupling the resonators with each other.

However, in the resonator of $\frac{1}{2}$ wavelength or the resonator of $\frac{1}{4}$ wavelength, the resonator having a resonance frequency of 2-3 GHz becomes substantially large because the line electrode is long. In the resonator having a coil electrode, since the coil electrode has a circinate shape, magnetic fluxes are influenced by one another between the adjacent lines. Thus, it is difficult for an electric current to flow. Therefore, a substantial resistance increases and Q becomes lower. When the resonator is miniaturized, the distance between the adjacent lines becomes short, and influence of magnetic fluxes becomes larger, thus the current flow problem increases. Because of the current flow problem, the insertion loss of the band-pass filter using such resonators increases.

SUMMARY OF THE INVENTION

Therefore, it is an object of the present invention to provide a resonator which can be miniaturized and Q is scarcely deteriorated even when it is miniaturized. Furthermore, it is an object of the present invention to provide a band-pass filter which can be miniaturized and insertion loss is small even when it is miniaturized.

The present invention is directed to a resonator comprising, coil electrodes formed on plural dielectric layers to form a spiral electrode by connecting with each other, an earth terminal drawn out from one of the coil electrodes toward the end portion of the dielectric layer, an input/output terminal drawn out from one of the coil electrodes toward the end portion of the dielectric layer at a distance from the earth terminal, and shield electrodes formed one dielectric layers and located on either side of the plural coil electrodes at a distance from the coil electrodes and connected to the earth terminal.

A capacitor electrode may be formed between the coil electrodes and the shield electrode. Capacitance is made with the capacitor electrode and the shield electrode. In this case, the capacitor electrode and the shield electrode are electrically connected with each other.

Furthermore, the present invention is directed to a band-pass filter comprising, plural coil electrodes formed on plural dielectric layers to form plural spiral electrodes by connecting with each other, earth terminals drawn out severally from one of the coil electrodes which form the several spiral electrodes toward the end portions of the dielectric layer, input/output terminals drawn out severally from the coil electrodes from which the earth terminals are drawn out toward the end portions of the dielectric layer at a distance from the earth terminals, and shield electrodes formed on dielectric layer and located on either side of the plural coil electrodes at a distance from the coil electrodes and connected to the earth terminals.

Capacitor electrodes may be formed between the coil electrodes and the shield electrode. Capacitance is made with the capacitor electrode and the shield electrode. In this case, the capacitor electrodes and the shield electrodes are electrically connected with each other.

The spiral electrode is formed by laminating the dielectric layers on which the coil electrodes are formed and connecting the coil electrodes with each other. In this case, the dielectric layer exists between the adjacent lines. Capacitance is formed between the capacitor electrode and the shield electrode by forming the capacitor electrode between the coil electrodes and the shield electrode.

According to the present invention, since the spiral electrode is made of plural coil electrodes, the length of the spiral electrode can be adjusted by controlling the number of laminated dielectric layers. In this case, even when the spiral electrode becomes long, the resonator does not become large compared with the resonator having the electrode on only one surface of the dielectric plate. Adequate distance between the adjacent coil electrodes can be provided because the dielectric layer exists between the adjacent coil electrodes, thus influence of magnetic fluxes between the coil electrodes can be minimized. Therefore, Q of the resonator is scarcely deteriorated and the resonator can be miniaturized. Furthermore, the resonance frequency can be lowered by forming capacitance between the capacitor electrode and the shield electrode, thus the resonance frequency of the resonator can be adjusted.

Since deterioration of Q can be prevented, insertion loss of the band-pass filter can be minimized by using the resonator. Furthermore, the passband frequency can be lowered by forming capacitance between the capacitor electrode and the shield electrode, thus the passband frequency of the band-pass filter can be adjusted.

The shield effect of the resonator at a high frequency band can be improved by the shield electrode. And, impedance of the resonator can be adjusted by changing the distance between the earth terminal and the take-out terminal. Therefore, the resonator and the band-pass filter can be manufactured with regard to the impedance matching with the outer circuit.

The above and further objects, features, aspects and advantages of the present invention will be more fully apparent from the following detailed description of the embodiments with accompanying drawings.

BRIEF DESCRIPTION OF THE DRAWINGS

FIG. 2 is an exploded perspective view showing a laminating body of the resonator of FIG. 1.

FIG. 4 is an equivalent circuit diagram of the resonator of FIG. 1.

FIG. 6 is a perspective view showing an exploded perspective view showing an another embodiment of the present invention.

FIG. 7 is an equivalent circuit diagram of the resonator of FIG. 6.

FIG. 9 is a perspective view showing an embodiment of a band-pass filter using the resonator of the present invention.

FIG. 11 is an equivalent circuit diagram of the band-pass filter of FIG. 9.

FIG. 14 is a graph showing frequency characteristics of the band-pass filter of FIG. 13.

FIG. 16 is an equivalent circuit diagram of the band-pass filter of FIG. 15.

FIG. 17 is a graph showing frequency characteristics of the band-pass filter of FIG. 15.

FIG. 19 is a graph showing frequency characteristics of the band-pass filter of FIG. 15.

DESCRIPTION OF THE PREFERRED EMBODIMENTS

Figure 1:
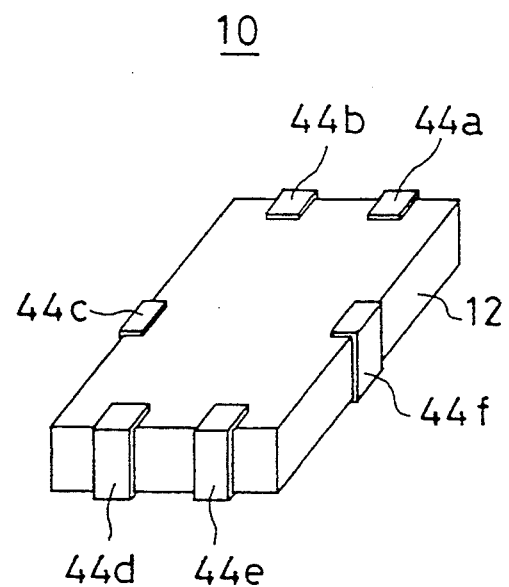
FIG. 1 is a perspective view showing an embodiment of the present invention.

FIG. 1 is a perspective view showing an embodiment of the present invention. A resonator 10 includes a laminated body 12. The laminated body 12 includes a first dielectric layer 14 as shown in FIG. 2. A first shield electrode 16 is formed on the first dielectric layer 14. The first shield electrode 16 is formed substantially throughout the surface of the first dielectric layer 14, and drawn out to opposed end portions.

A second dielectric layer 18 is disposed on the first shield electrode 16. A first coil electrode 20 is formed on the second dielectric layer 18. The first coil electrode 20 is formed to have a U-shape on one half region of one surface of the second dielectric layer 18. An earth terminal 22 is drawn out from one end of the first coil electrode 20 toward an end portion of the second dielectric layer 18. An input/output terminal 24 is drawn out from the intermediate portion of the first coil electrode 20 toward an end portion of the second dielectric layer 18. In this embodiment, the input/output terminal 24 is drawn out to the end portion of the second dielectric layer 18 adjoining to the end portion where the earth terminal 22 is drawn out. The first coil electrode 20 and the earth terminal 22 are formed on one major surface of the second dielectric layer 18. The other major surface of the second dielectric layer 18 is located opposite to the first shield electrode 16. The input/output terminal 24 is drawn out to the end portion corresponding to the portion where the first shield electrode 16 is not formed.

A third dielectric layer 26 is formed on the first coil electrode 20. A second coil electrode 28 is formed on the third dielectric layer 26. The second coil electrode 28 is formed U-shape inverse to the first coil electrode 20 on the other half region from the region where the first coil electrode 20 is formed. A through hole 30 is formed through the third dielectric layer 26 at an end of the second coil electrode 28. The other end of the first coil electrode 20 and one end of the second coil electrode 28 are connected via the through hole 30.

A fourth dielectric layer 32 is disposed on the second coil electrode 28. A third coil electrode 34 is formed on the fourth dielectric layer 32. The third coil electrode 34 is formed to have the same U-shape as the first coil electrode 20 on the same half region as the region where the first coil electrode 20 is formed. A through hole 36 is formed through the fourth dielectric layer 32 at one end of the third coil electrode 34. The other end of the second coil electrode 28 and one end of the third coil electrode 34 are connected via the through hole 36. A spiral electrode is formed by connecting the first coil electrode 20, the second coil electrode 28 and the third coil electrode 34.

A fifth dielectric layer 38 is disposed on the third coil electrode 34. A second shield electrode 40 is formed on the fifth dielectric layer 38. The second shield electrode 40 is formed to have the same shape as the first shield electrode 16. A sixth dielectric layer 42 is disposed on the second shield electrode 40. The laminated body 12 is formed by laminating the dielectric layers.

External electrodes 44a, 44b, 44c, 44d, 44e and 44f are formed at the end portions of the laminated body 12.

The external electrodes 44a, 44b, 44d and 44e are formed at the end portions where the first shield electrode 16 and the second shield electrode 40 are drawn out. The external electrodes 44a, 44b, 44d and 44e are connected to the first shield electrode 16 and the second shield electrode 40, and simultaneously the external electrode 44e is connected to the earth terminal 22. The external electrodes 44c and 44f are formed at the end portions where the first shield electrode 16 and the second shield electrode 40 are not drawn out. The external electrode 44c is connected to the input/output terminal 24.

Figure 3:
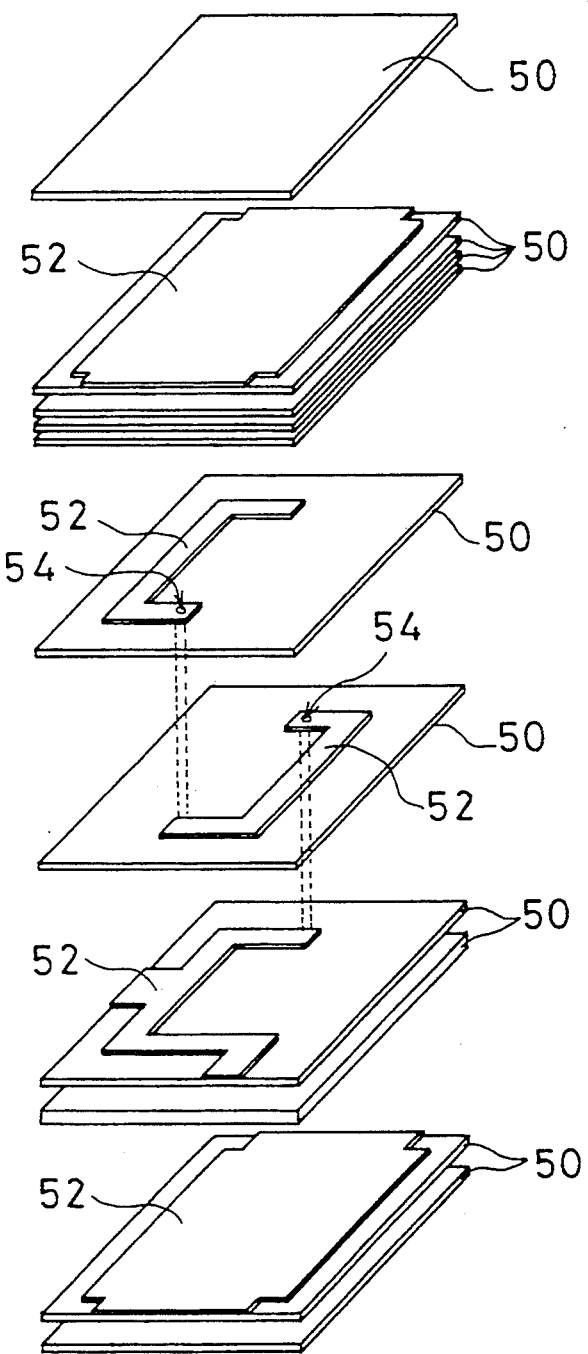
FIG. 3 is an illustrative view showing one manufacturing process of the resonator of FIG. 1.

For manufacturing the resonator 10, as shown in FIG. 3, plural ceramic green sheets 50 which are formed with dielectric material, that is, insulation material, are prepared. On the plural ceramic green sheets 50, paste layers 52 are formed by printing a conductive paste in shapes of the first shield electrode 16, the earth terminal 22, the input/output terminal 24, the first coil electrode 20, the second coil electrode 28, the third coil electrode 34 and the second shield electrode 40. Through holes 54 are formed through the ceramic green sheets 50 at the ends of the paste layers 52 corresponding to the second coil electrode 28 and the third coil electrode 34. The paste layers 52 corresponding to the first coil electrode 20, the second coil electrode 28 and the third coil electrode 34 are connected by filling the conductive paste in the through holes 54. The required number of ceramic green sheets 50 are put between the printed ceramic green sheets so as to obtain the thickness of the dielectric layers. The laminated body is obtained by laminating and pressing the ceramic green sheets 50.

A conductive paste is printed on the laminated body so as to obtain the shape of the external electrodes 44a–44f. The conductive paste is connected to the required paste layer 52 in the laminated body. The resonator 10 is obtained by firing the laminated body. The laminated body may be fired before printing the conductive paste corresponding to the external electrodes, and the external electrodes may be sintered after firing the laminated body.

Figure 5:
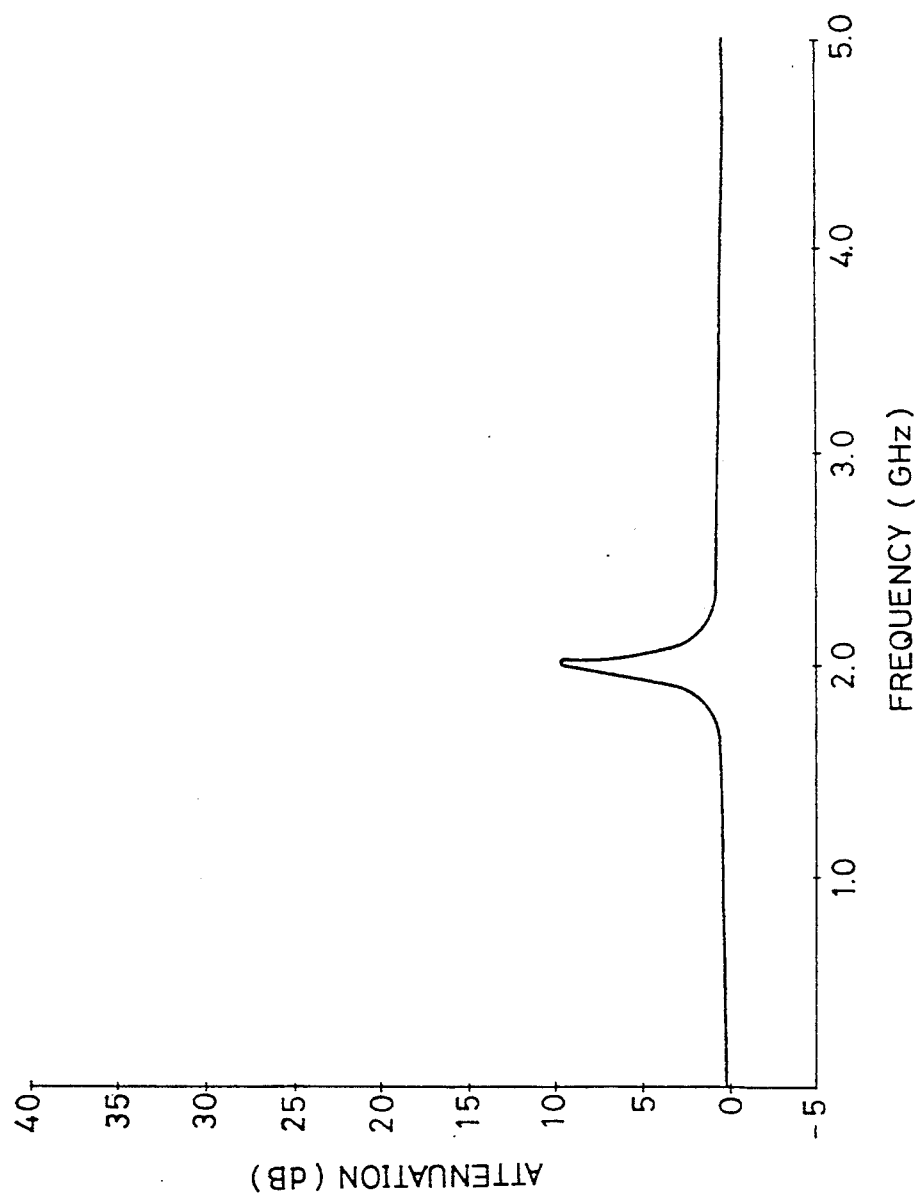
FIG. 5 is a graph showing frequency characteristics of the resonator of FIG. 1.

The resonator 10 operates as a $\frac{1}{4}$ wavelength resonator since the first coil electrode 20 and two shield electrodes 16, 40 are connected via the earth terminal 22 and the external electrode 44e. In the resonator 10, inductance is formed at the spiral electrode which is made of the coil electrodes 20, 28 and 34. Some capacitance is formed between the coil electrodes 20, 28, 34 and two shield electrodes 16, 40. Therefore, the resonator 10 has an equivalent circuit as shown in FIG. 4. The frequency characteristics of the resonator 10 is shown in FIG. 5. In the frequency characteristics, the resonance frequency exists at about 2 GHz.

In the resonator 10, the length of the spiral electrode can be adjusted optionally by controlling the number of the dielectric layers on which the coil electrodes are formed. Therefore, the resonance frequency of the resonator 10 can be variably designed. The manufacturing process of the resonator can be simplified because the ceramic green sheets having paste layers corresponding to two kinds of coil electrodes are laminated alternately. In this embodiment, the width of the coil electrodes 20, 28 and 34 are below 0.3 mm to decrease the distributed capacity, and thickness of the coil electrodes 20, 28 and 34 are above 6 $\mu$m, and thickness of the third dielectric layer 26 and the fourth dielectric layer 32 are about 100 $\mu$m.

Because the resonator 10 has a laminated structure, the resonator 10 can be miniaturized even when the spiral electrode becomes long. For example, in the case of a resonator having a resonance frequency of 1.0 GHz and an effective dielectric constant of 25, the length of the strip line of $\frac{1}{4}$ wavelength is 15 mm, and the resonator having the circinate electrode can be miniaturized smaller than that resonator. In the resonator 10 of the present invention, adjacent lines of the coil electrodes are disposed in the laminated direction with a dielectric layer therebetween, because the spiral electrode is made of the coil electrodes 20, 28 and 34. Therefore, the dielectric layer on which the coil electrode is formed need not be made large even when the spiral electrode becomes long, and the resonator can be miniaturized even more. Q of the resonator is scarcely deteriorated by the influence of magnetic fluxes because enough distance between the adjacent coil electrodes is secured by the dielectric layer.

In the resonator 10, impedance can be adjusted by changing the distance between the earth terminal 22 and the input/output terminal 24. In the above embodiment, though the earth terminal 22 and the input/output terminal 24 are drawn out to the adjoining end portions of the second dielectric layer 18, these electrodes may be drawn out to the same end of the dielectric layer, and the electrodes may be drawn out to any ends of the dielectric layer according to the distance between the electrodes. Furthermore, impedance can be adjusted by changing the width of the coil electrodes 20, 28, 34, or by changing the distance between the coil electrodes 20, 28, 34 and the shield electrodes 16, 40. As such, impedance of the resonator can be adjusted easily, and thus the resonator can be manufactured with the impedance matching that of the external circuit.

The shielding effect at a high frequency band is excellent because the shield electrodes 16, 40 are formed at both sides of the coil electrodes 20, 28, and 34. Thus, stabilized characteristics can be obtained.

As shown in FIG. 6, a seventh dielectric layer 60 may be disposed on the third coil electrode 34 on which a capacitor electrode 62 is formed. The capacitor electrode 62 is formed in a plane shape and located opposite to the major surface of the fifth dielectric layer 38 that does not contain the second shield electrode 40. A through hole 64 is formed through the seventh dielectric layer 60 and the capacitor electrode 62. The capacitor electrode 62 and the third coil electrode 34 are connected via the through hole 64. In the resonator 10, capacitance is formed between the capacitor electrode 62 and the shield electrodes 16, 40. Therefore, the equivalent circuit of the resonator 10 shown in FIG. 6 is the circuit having the capacitance connected to the inductance in series as shown in FIG. 7.

Figure 8:
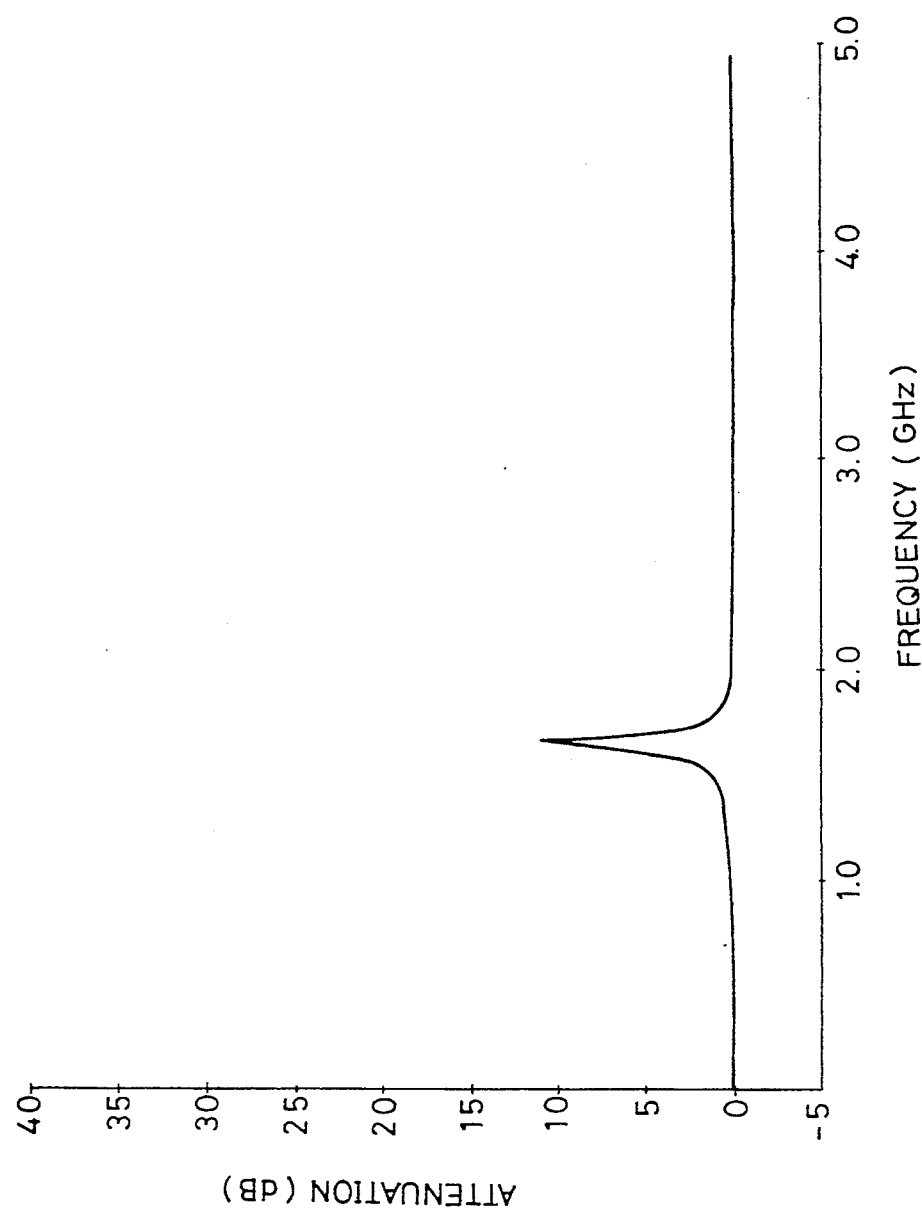
FIG. 8 is a graph showing frequency characteristics of the resonator of FIG. 6.

The size of the electrodes other than the capacitor electrode 62 are made as same the electrodes of the resonator shown in FIGS. 1 and 2, and characteristics of the resonator 10 of FIG. 6 is measured, and the result is shown in FIG. 8. Though the resonator of FIGS. 1 and 2 has a resonance frequency of 2 GHz, the resonator of FIG. 8 has a resonance frequency of about 1.6 GHz. As such, the resonance frequency of the resonator can be changed by including the capacitor electrode 62. In the resonator 10, capacitance formed between the capacitor electrode 62 and the shield electrodes 16, 40 can be controlled by changing the area of the capacitor electrode 62 or changing the thickness of the dielectric layer 38 between the capacitor electrode 62 and the second shield electrode 40. As such, the resonance frequency of the resonator can be adjusted by changing the capacitance.

Figure 10:
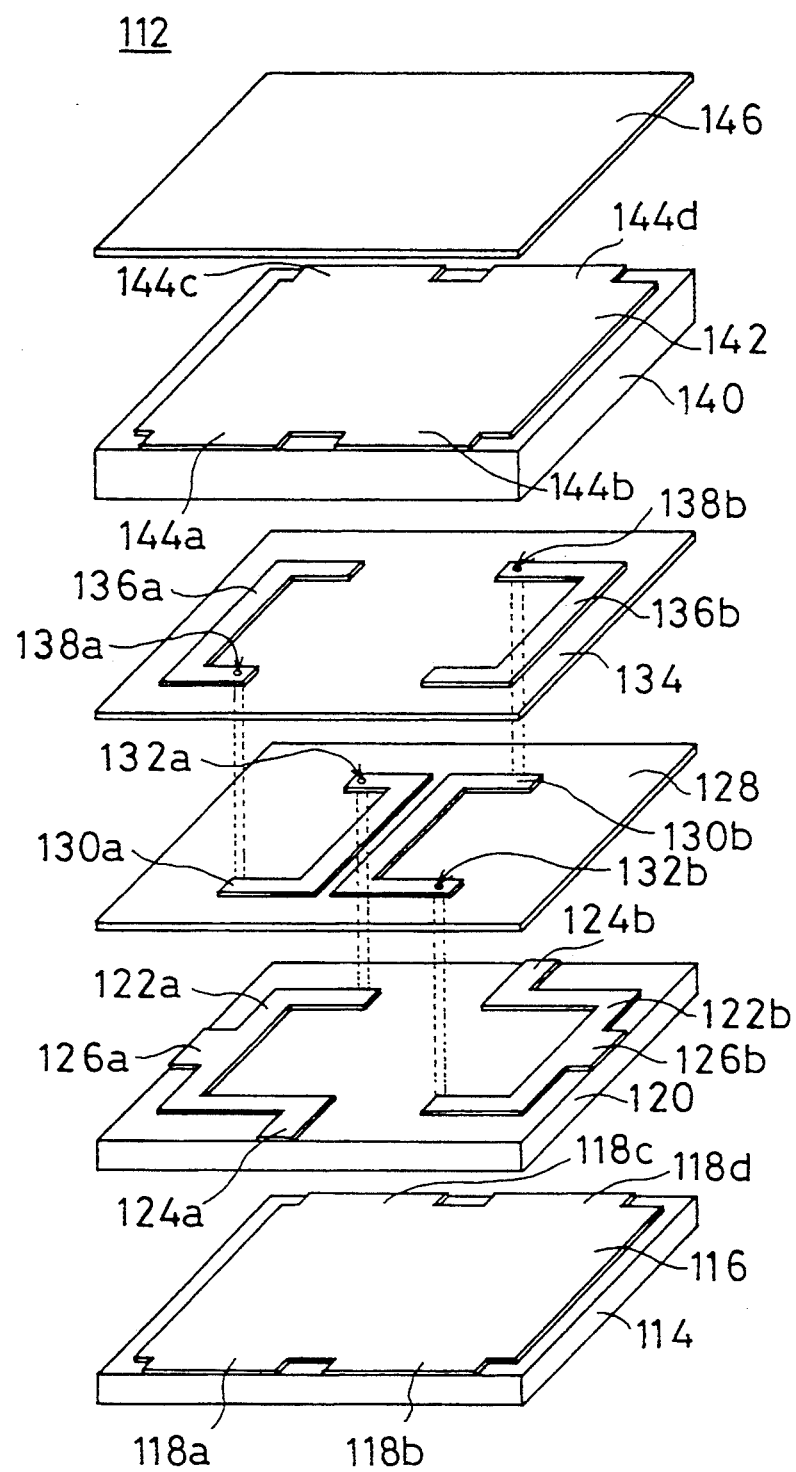
FIG. 10 is an exploded perspective view showing a laminating body of the band-pass filter of FIG. 9.

FIG. 9 is a perspective view showing an embodiment of a band-pass filter using the resonator of the present invention. The band-pass filter 100 includes a laminated body 112. The laminated body 112 includes a first dielectric layer 114 as shown in FIG. 10. A first shield electrode 116 is formed on the first dielectric layer 114. The first shield electrode 116 is formed substantially throughout the surface of the first dielectric layer 114. Four earth terminals 118a, 118b, 118c and 118d are drawn out from the first shield. electrode 114 toward the opposite end portions of the first dielectric layer 114.

A second dielectric layer 120 is disposed on the first shield electrode 116. Two first coil electrodes 122a and 122b are formed on the second dielectric layer 120. One first coil electrode 122a is formed to have a U-shape at one half region on the surface of the second dielectric layer 120. And, the other first coil electrode 122b is formed to have U-shape inverse to the first coil electrode 122a at the other half region on the surface of the second dielectric layer 120. Earth terminals 124a and 124b are drawn out from the ends of the first coil electrodes 122a and 122b toward the opposite end portions of the second dielectric layer 120. Input/output terminals 126a and 126b are drawn out from the intermediate portions of the first coil electrodes 122a and 122b toward the opposite end portions of the second dielectric layer 120. In this embodiment, the input/output electrodes 126a and 126b are drawn out to the end portions of the second dielectric layer 120 adjoining the end portions where the earth terminals 124a and 124b are drawn out. That is, the first coil electrodes 122a, 122b are formed on the major surface of the second dielectric layer 120 that is not disposed opposite to the first shield electrode 116, and the earth terminals 124a and 124b are located in alignment with the locations of earth terminals 118a and 118d, respectively. The input/output electrodes 126a and 126b are drawn out to the end portions corresponding to the portions where the first shield electrode 116 is not formed.

A third dielectric layer 128 is disposed on the first coil electrodes 122a and 122b. Second coil electrodes 130a and 130b are formed on the third dielectric layer 128. The second coil electrodes 130a and 130b are formed to have a U-shape inverse to each other. One second coil electrode 130a is formed to have a U-shape inverse to the first coil electrode 122a, and the other second electrode 130b is formed to have a U-shape inverse to the first coil electrode 122b. Through holes 132a and 132b are formed through the third dielectric layer 128 at the ends of the second coil electrodes 130a and 130b. The other end of the first coil electrode 122a and one end of the second coil electrode 130a are connected via the through hole 132a, and the other end of the first coil electrode 122b and one end of the second coil electrode 130b are connected via the through hole 132b.

A fourth dielectric layer 134 is disposed on the second coil electrodes 130a and 130b. Third coil electrodes 136a and 136b are formed on the fourth dielectric layer 134. The third coil electrodes 136a and 136b are formed to have a U-shape inverse to each other. One third coil electrode 136a is formed to have a U-shape inverse to the second coil electrode 130a, and the other third electrode 136b is formed to have a U-shape inverse to the second coil electrode 130b. That is, each of third coil electrodes 136a, 136b is formed to have the same U-shape as each of the first coil electrodes 122a, 122b. Through holes 138a and 138b are formed through the fourth dielectric layer 134 at one of the ends of each of the third coil electrodes 136a and 136b. The other end of the second coil electrode 130a and one end of the third coil electrode 136a are connected via the through hole 138a, and the other end of the second coil electrode 130b and one end of the third coil electrode 136b are connected via the through hole 138b. One spiral electrode is formed by connecting the first coil electrode 122a, the second coil electrode 130a and the third coil electrode 136a. And, the other spiral electrode is formed by connecting the first coil electrode 122b, the second coil electrode 130b and the third coil electrode 136b. Two spiral electrodes are formed in the same winding direction. Since two spiral electrodes are formed adjacent with each other, the spiral electrodes are coupled magnetically.

A fifth dielectric layer 140 is disposed on the third coil electrodes 136a and 136b. A second shield electrode 142 is formed on the fifth dielectric layer 140. The second shield electrode 142 is formed to have the same shape as the first shield electrode 116. Four earth terminals 144a, 144b, 144c and 144d are formed so as to extend from second shield electrode 142 toward the opposite end portions of the fifth dielectric layer 140. The earth terminals 144a–144d are formed at the portions corresponding to the earth terminals 118a–118b of the first shield electrode 116. A sixth dielectric layer 146 is disposed on the second shield electrode 142.

External electrodes 148a, 148b, 148c, 148d, 148e, 148f, 148g, 148h, 148i and 148j are formed at the end portions of the laminated body 112. The external electrodes 148a and 148b are connected to the earth terminal 118a of the first shield electrode 116 and to the earth terminal 144a of the second shield electrode 142, and simultaneously the external electrode 148b is connected to the earth terminal 124a of the first coil electrode 122a. The external electrodes 148c and 148d are connected to the earth terminal 118b of the first shield electrode 116 and to the earth terminal 144b of the second shield electrode 142. The external electrode 148e is connected to the input/output terminal 126b of the first coil electrode 122b. The external electrodes 148f and 148g are connected to the earth terminal 118d of the first shield electrode 116 and to the earth terminal 144d of the second shield electrode 142, and simultaneously the external electrode 148g is connected to the earth terminal 124b of the first coil electrodes 122b. The external electrode 148h and 148i are connected to the earth terminal 118c of the first shield electrode 116 and to the earth terminal 144c of the second shield electrode 142. The external electrode 148j is connected to the input/output terminal 126a of the first coil electrode 122a.

Figure 12:
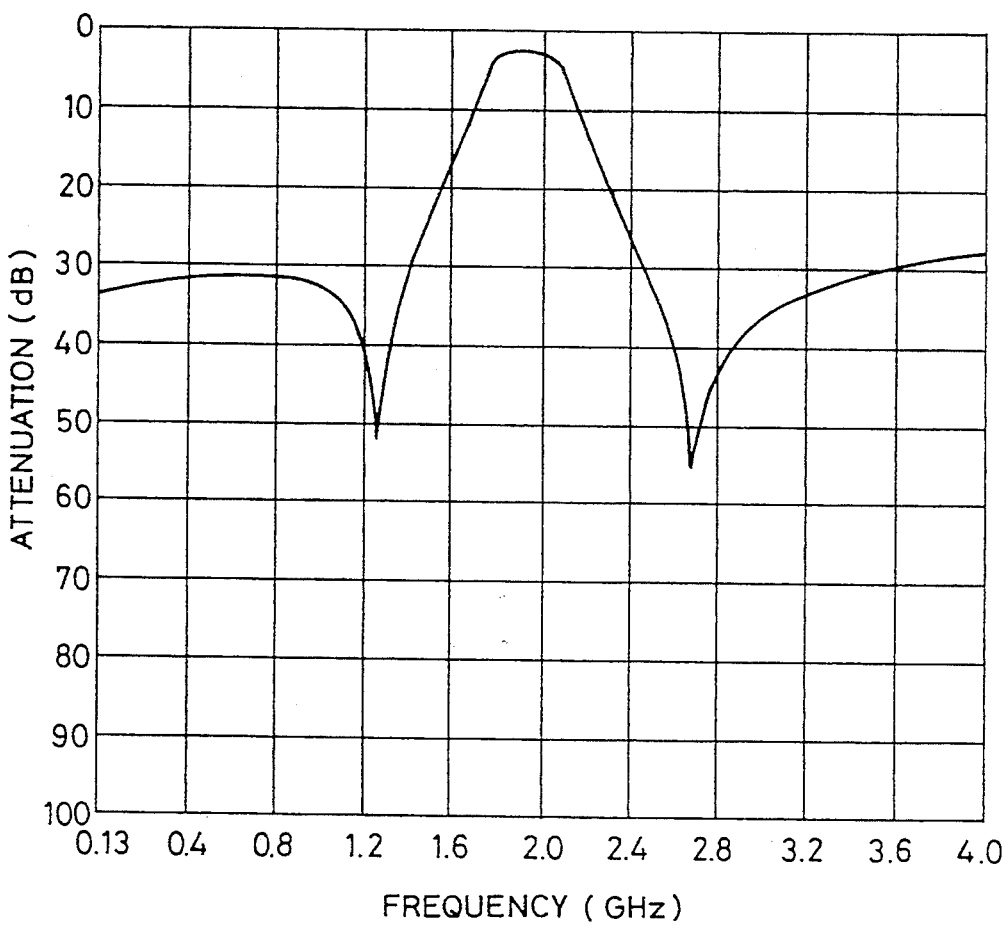
FIG. 12 is a graph showing frequency characteristics of the band-pass filter of FIG. 9.

In the band-pass filter 100, since one first coil electrode 122a and two shield electrodes 116, 142 are connected via the earth terminals 118a, 124a, 144a and the external electrode 148b, and the other first coil electrode 122b and two shield electrodes 116, 142 are connected via the earth terminals 118d, 124b, 144d and the external electrode 148g, two spiral electrodes operate as ¼ wavelength resonators. Two spiral electrodes are magnetically coupled with each other because the spiral electrodes are formed in close proximity to each other. In the band-pass filter 100, inductance is formed at the spiral electrodes which are made of the coil electrodes 122a, 130a, 136a and of the coil electrodes 122b, 130b, 136b. Some capacitance is formed between the coil electrodes 122a, 122b, 130a, 130b, 136a, 136b and two shield electrodes 116, 142. Therefore, the band-pass filter 100 has an equivalent circuit as shown in FIG. 11. The frequency characteristics of the band-pass filter is shown in FIG. 12. In the frequency characteristics, the passband frequency exists at about 1.9 GHz.

In the band-pass filter 100, length of the spiral electrodes can be adjusted optionally by controlling the number of the dielectric layers on which the coil electrodes are formed. Therefore, resonance frequency of each resonator can be variably designed, and thus passband frequency of the band-pass filter 100 can be adjusted. The manufacturing process of the band-pass filter can be simplified because the ceramic green sheets having paste layers corresponding to two kind of coil electrodes are laminated alternately.

Because the band-pass filter 100 has a laminated structure, the band-pass filter 100 can be miniaturized even when the spiral electrodes become long. In the band-pass filter 100 of the present invention, adjacent lines of each spiral electrode are disposed in the laminated direction with a dielectric layer therebetween, because the spiral electrodes are made of the coil electrodes 122a, 122b, 130a, 130b, 136a and 136b. Therefore, the dielectric layer on which the coil electrodes are formed need not be made large even when the spiral electrodes become long, and the band-pass filter can be miniaturized even more. Q of each resonator is scarcely deteriorated by the influence of magnetic fluxes because enough distance between the adjacent coil electrodes is secured by the dielectric layer, and thus the insertion loss of the band-pass filter can be minimized. In the band-pass filter 100, impedance can be adjusted by changing the distance between the earth terminal 124a and the input/output terminal 126a of the first coil electrode 122a, or the distance of the earth terminal 124b and the input/output terminal 126b of the first coil electrode 122b. In the above embodiment, the earth terminals 124a, 124b and the input/output terminals 126a, 126b are drawn out to the different end portions of the second dielectric layer 120. However, it is possible to draw out the earth terminal 124a and the input/output terminal 126a to the same end, and to draw out the earth terminal 126b and the input/output terminal 126b to the same end, and these electrodes may be drawn out to any ends of the dielectric layer according to the distance between the electrodes. Furthermore, impedance can be adjusted by changing the width of the coil electrodes 122a, 122b, 130a, 130b, 136a, 136b, and by changing the distance between the coil electrodes and the shield electrodes 116, 142. As such, impedance of the band-pass filter can be adjusted easily, and thus the band-pass filter can be manufactured with the impedance matching that of the external circuit.

The shielding effect at a high frequency band is excellent because the shield electrodes 116, 142 are formed at both sides of the coil electrodes 122a, 122b, 130a, 130b, 136a, and 136b. Thus, stabilized characteristics can be obtained.

Figure 13:
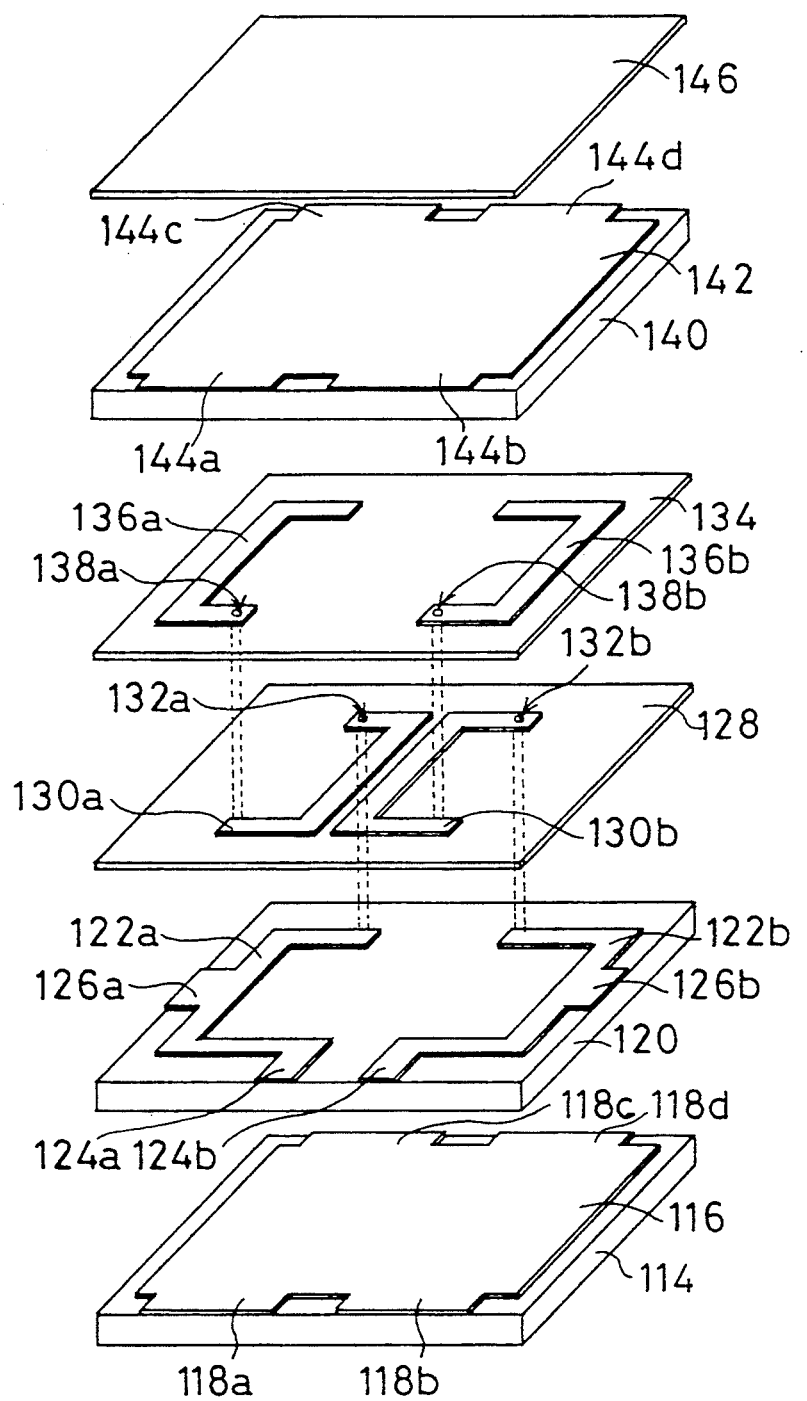
FIG. 13 is a perspective view showing a modified example of the band-pass filter of FIG. 9.

The earth terminal 124a of the first coil electrode 122a and the earth terminal 124b of the first coil electrode 122b may be drawn out to the same end of the second dielectric layer 120 as shown in FIG. 13. In this case, two spiral electrodes are formed in an inverse winding direction. In such case, two spiral electrodes are coupled magnetically, and the band-pass filter is made. The frequency characteristics of the band-pass filter 100 is shown in FIG. 14. As shown in FIG. 14, the band-pass filter 100 has a passband frequency at about 1.9 GHz, and attenuation at a low frequency side is large and attenuation band is broad as compared with the characteristics of FIG. 12.

Figure 15:
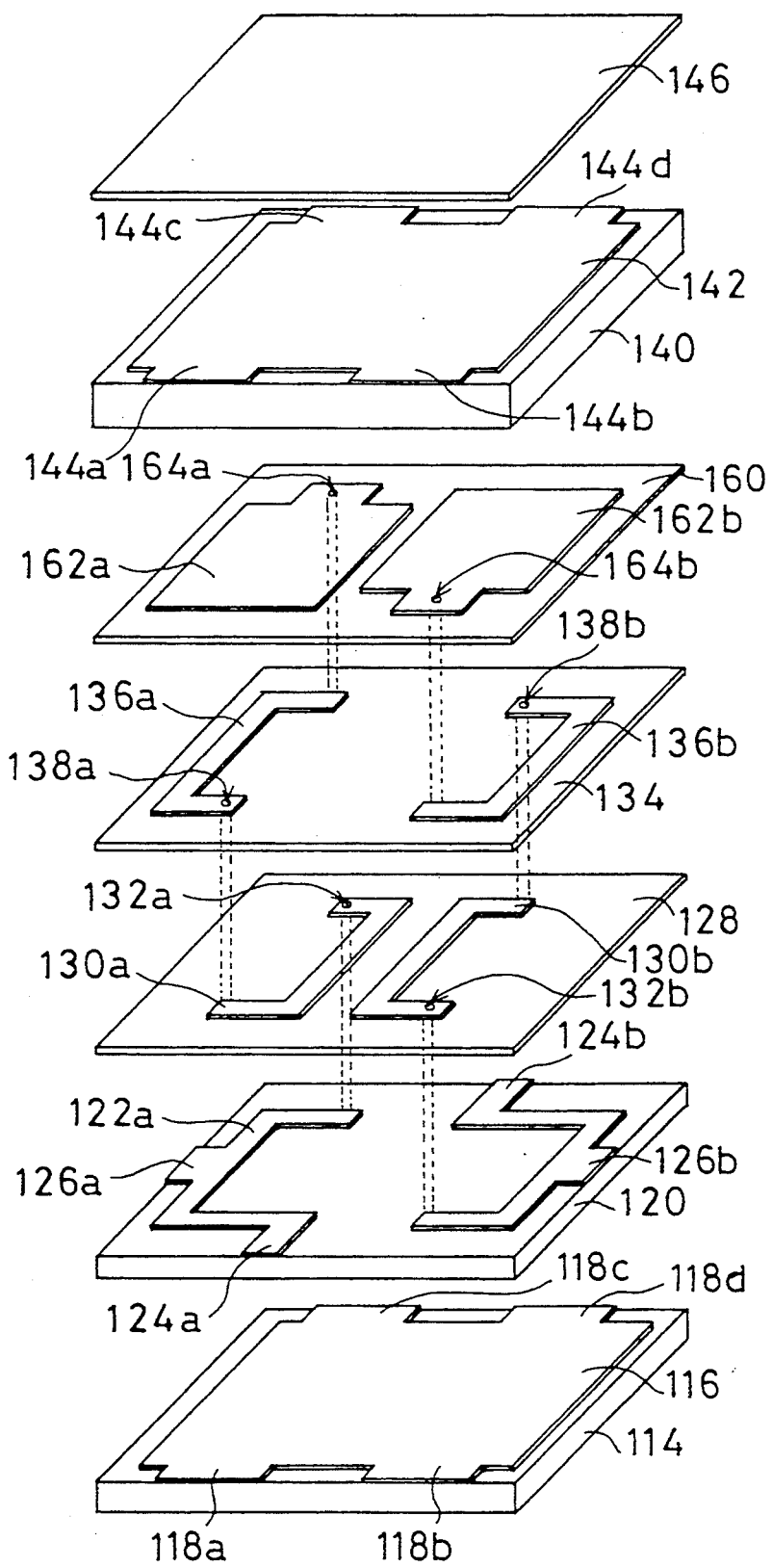
FIG. 15 is an exploded perspective view showing an another embodiment of the band-pass filter of the present invention.

As shown in FIG. 15, a seventh dielectric layer 160 may be disposed on the third coil electrodes 136a, 136b, and capacitor electrodes 162a and 162b may be formed on the seventh dielectric layer 160. The capacitor electrodes 162a and 162b are formed respectively at the portions corresponding to the third coil electrodes 136a and 136b. Each of the capacitor electrodes 162a and 162b is formed in a plane shape on the opposite portion to the second shield electrode 142. A through hole 164a is formed through the seventh dielectric layer 160 and the capacitor electrode 162a, and a through hole 164b is formed through the seventh dielectric layer 160 and the capacitor electrode 162b. The capacitor electrode 162a and the third coil electrode 136a are connected via the through hole 164a, and the capacitor electrode 162b and the third coil electrode 136b are connected via the through hole 164b. In the band-pass filter 100, capacitance is formed between capacitor electrode 162a and shield electrodes 116, 142, and between capacitance electrode 162b and the shield electrodes 116, 142. Therefore, as shown in FIG. 16, the equivalent circuit of the band-pass filter 100 of FIG. 15 is the circuit which includes two parallel circuits including an inductance and two capacitance, and the inductance of two parallel circuits are magnetically coupled with each other.

The size of the electrodes other than the capacitor electrodes 162a and 162b are made the same as the electrodes of the band-pass filter of FIGS. 9 and 10, and frequency characteristics of the band-pass filter of FIG. 15 is measured, and the result is shown in FIG. 17. Though the band-pass filter of FIGS. 9 and 10 has a passband frequency of about 1.9 GHz, the band-pass filter of FIG. 17 has a passband frequency of about 1.6 GHz. As such, the frequency characteristics of the band-pass filter can be changed by providing the capacitor electrodes 162a and 162b. In the band-pass filter 100, capacitance between the capacitor electrodes 162a, 162b and the shield electrodes 116, 142 can be controlled by changing the area of the capacitor electrodes 162a, 162b, or by changing the thickness of the dielectric layer 140 between the capacitor electrodes 162a, 162b and the second shield electrode 142. As such, the passband frequency of the band-pass filter 100 can be adjusted by changing the capacitance.

Figure 18:
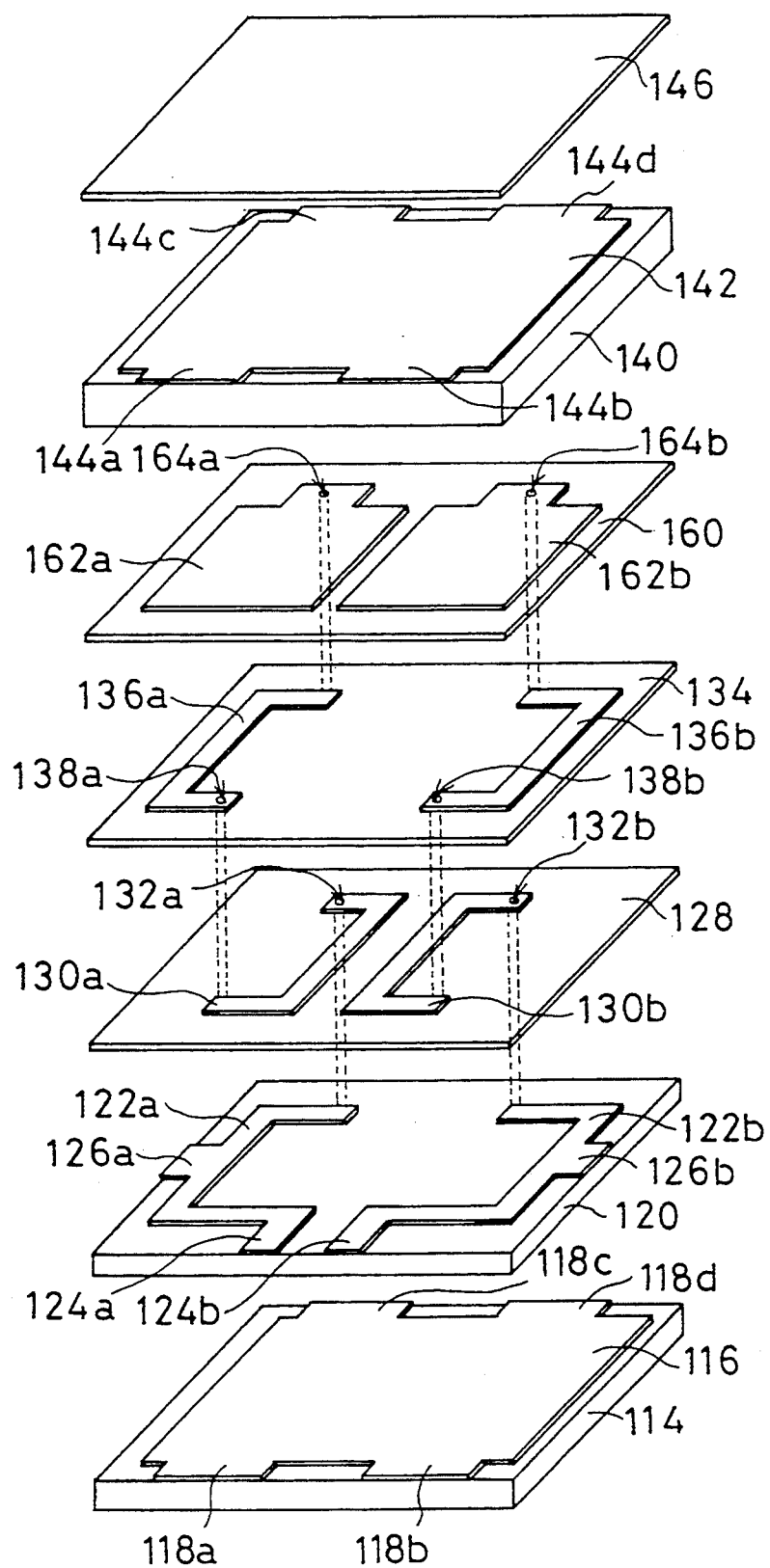
FIG. 18 is an exploded perspective view showing a modified example of the band-pass filter of FIG. 15.
Figure 20:
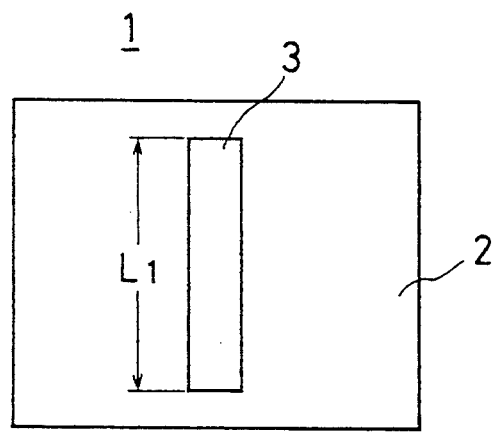
FIG. 20 is a plan view showing an example of a conventional resonator which is a background of the present invention.
Figure 21:
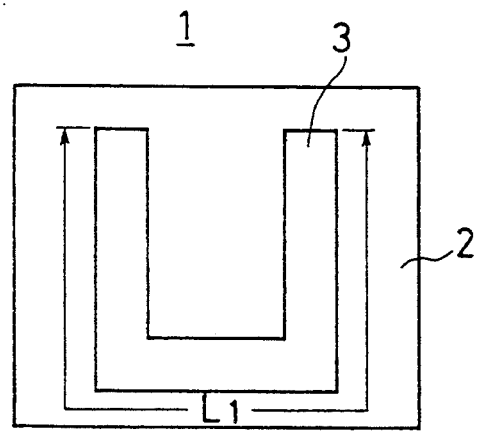
FIG. 21 is a plan view showing a modified example of the conventional resonator of FIG. 20.
Figure 22:
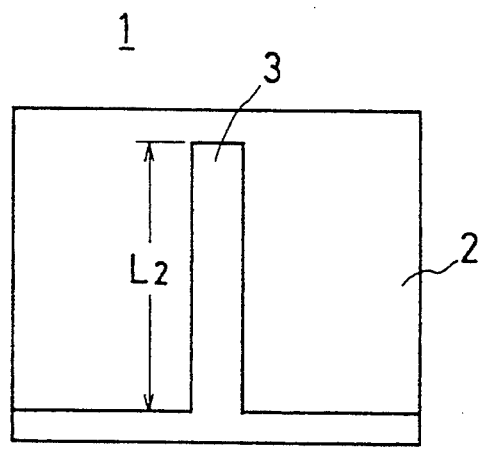
FIG. 22 is a plan view showing an another example of a conventional resonator.
Figure 23:
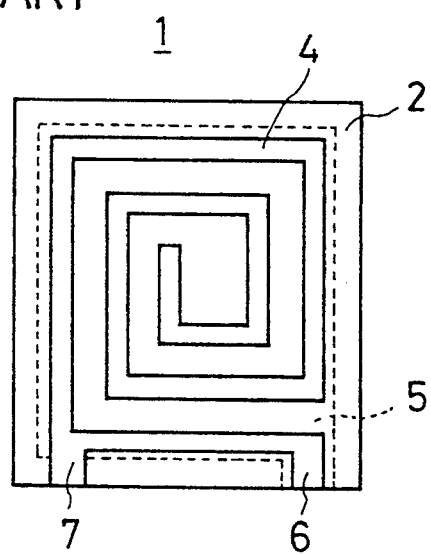
FIG. 23 is a plan view showing still another example of a conventional resonator.

As shown in FIG. 18, the capacitor electrodes 162a and 162b may be formed in the band-pass filter having spiral electrodes which are in an inverse winding direction. In this case, as shown in FIG. 19, the band-pass filter has a passband frequency of about 1.6 GHz, and attenuation at a low frequency side becomes large and attenuation at a high frequency side becomes small as compared with the characteristics of FIG. 17.

In the above embodiments, two spiral electrodes are formed, however three or more spiral electrodes may be formed. In this case, three or more coil electrodes are formed on one dielectric layer, and plural dielectric layers are laminated to connect the coil electrodes in a laminating direction. These plural spiral electrodes are coupled magnetically with each other.

While the present invention has been particularly described and shown, it is to be understood that such description is used as an example rather than limitation, and the spirit and scope of the present invention is determined solely by the terms of the appended claims.

What is claimed is:

1. A resonator comprising:
   a) a spiral electrode including:
      1) a plurality of dielectric layers;
      2) a plurality of coil electrodes formed on said plurality of dielectric layers;
      3) a plurality of through holes formed in said plurality of dielectric layers and said plurality of coil electrodes, said coil electrodes being connected with each other via said plurality of through holes;
   b) an earth terminal drawn out from one end of said spiral electrode toward a periphery of one of said dielectric layers;
   c) an input/output terminal drawn out from said spiral electrode toward the periphery of said one of said dielectric layers such that said input/output terminal is spaced from said earth terminal;
   d) a plurality of shield electrodes spaced from said spiral electrode and connected to said earth terminal, said spiral electrode being located between said plurality of shield electrodes; and
   e) a capacitor electrode formed between said spiral electrode and one of said shield electrodes to make capacitance, and said capacitor electrode being connected to the other end of said spiral electrode.

2. A band-pass filter comprising:
   a) a plurality of spiral electrodes each including:
      1) a plurality of dielectric layers;
      2) a plurality of coil electrodes formed on said plurality of dielectric layers;
      3) a plurality of through holes formed in said plurality of dielectric layers and said plurality of coil electrodes, said coil electrodes being connected with each other via said plurality of through holes;
   b) a plurality of earth terminals drawn out from one end of each of said spiral electrodes toward a periphery of one of said plurality of dielectric layers;
   c) a plurality of input/output terminals drawn out from said plurality of spiral electrodes toward the periphery of said one of said dielectric layers such that said plurality of input/output terminals are spaced from said earth terminals;
   d) a plurality of shield electrodes spaced from said plurality of spiral electrodes and connected to said plurality of earth terminals, said plurality of spiral electrodes being located between said plurality of shield electrodes;
   e) a capacitor electrode formed between each of said plurality of spiral electrodes and said plurality of shield electrodes to make capacitance, and connected to the other end of each of said spiral electrodes.

3. A resonator as recited in claim 1, wherein said input/output terminal and said earth terminal are drawn out toward different sides of said one of said dielectric layers.

4. A resonator as recited in claim 1, wherein said input/output terminal and said earth terminal are drawn out toward a common side of said one of said dielectric layers.

5. A band-pass filter as recited in claim 2, wherein said input/output terminals and said earth terminals are drawn out toward different sides of said one of said dielectric layers.

6. A band-pass filter as recited in claim 2, wherein said input/output terminals and said earth terminals are drawn out toward a common side of said one of said dielectric layers.

* * * * *